US007881145B2

United States Patent
Lee et al.

(10) Patent No.: US 7,881,145 B2
(45) Date of Patent: Feb. 1, 2011

(54) SEMICONDUCTOR DEVICE AND SEMICONDUCTOR SYSTEM HAVING THE SAME

(75) Inventors: Kwang Jin Lee, Hwaseong-si (KR); Joon Min Park, Seoul (KR); Hye-Jin Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 37 days.

(21) Appl. No.: 12/453,872

(22) Filed: May 26, 2009

(65) Prior Publication Data
US 2009/0303807 A1 Dec. 10, 2009

(30) Foreign Application Priority Data
Jun. 5, 2008 (KR) ...................... 10-2008-0053240

(51) Int. Cl.
*G11C 8/00* (2006.01)
(52) U.S. Cl. ................... 365/230.03; 365/163; 365/191
(58) Field of Classification Search ............ 365/230.03, 365/163, 191, 189.07
See application file for complete search history.

(56) References Cited

U.S. PATENT DOCUMENTS 7,079,417 B2   7/2006   Nam et al.
7,606,111 B2 * 10/2009  Lee et al. ............... 365/230.03

FOREIGN PATENT DOCUMENTS

JP   2000-268561    9/2000
JP   2007-250171    9/2007
KR   10-2005-0032892  4/2005

* cited by examiner

*Primary Examiner*—Huan Hoang
(74) *Attorney, Agent, or Firm*—Harness, Dickey & Pierce, P.L.C.

(57) ABSTRACT

A semiconductor device according to example embodiments may be configured so that, when a read command for performing a read operation is input while a write operation is performed, and when a memory bank accessed by a write address during the write operation is the same as a memory bank accessed by a read address during the read operation, the semiconductor device may suspend the write operation automatically or in response to an internal signal until the read operation is finished and performs the write operation after the read operation is finished.

20 Claims, 4 Drawing Sheets

SEMICONDUCTOR DEVICE AND SEMICONDUCTOR SYSTEM HAVING THE SAME

FOREIGN PRIORITY STATEMENT

This application claims priority under 35 U.S.C. §119 to Korean Patent Application No. 10-2008-0053240, filed on Jun. 5, 2008, in the Korean Intellectual Property Office (KIPO), the entire contents of which are incorporated herein by reference.

BACKGROUND

1. Field

Example embodiments relate to a semiconductor device, and more particularly, to a semiconductor device capable of performing a random read operation regardless of performance of a write operation and a semiconductor system having the same.

2. Description of the Related Art

A conventional flash memory device, e.g., a NOR flash memory device, may take more time to perform a write operation, e.g., a program operation or an erase operation, than to perform a read operation. When a read operation for reading data stored in a memory bank is input while a write operation is being performed, the NOR flash memory device may suspend a write operation according to a write suspend command input by an user and perform the write operation after the read operation is done. Therefore, a random access read characteristic of the NOR flash memory may fall behind with respect to a write operation of the NOR flash memory.

SUMMARY

Example embodiments provide a semiconductor device which may be capable of performing a random access read operation regardless of whether a write operation is performed, and a semiconductor system having the same.

Example embodiments provide a semiconductor device which may include a memory cell array comprising a first memory block and a second memory block, a control signal generation circuit, and a data write block. If a read command for performing a read operation is input while a write operation is being performed according to a write command, the control signal generation circuit may compare write addresses included in the write command for selecting the first memory block with read addresses included in the read command for selecting the second memory block, and generate a control signal according to a result of the comparison.

The data write block may perform the write operation for writing write data, input from outside the semiconductor device, to the first memory block. An operation of the data write block may be controlled based on the control signal.

The semiconductor device may further include a data output block performing the read operation for outputting data stored in the second memory block to the outside. When the first memory block and the second memory block are included in the same memory bank, an operation of the data write block may be suspended in response to the control signal until the read operation is finished.

The semiconductor device may further include a data output block performing the read operation for outputting data stored in the second memory block to the outside. When the first memory block and the second memory block are the same, an operation of the data write block may be suspended in response to the control signal until the read operation is finished.

When the write addresses and the read addresses are the same as each other, the control signal generation circuit may further output a bypass signal, and the data output block may output the write data of the data write block to the outside where the write operation is being performed, instead of outputting the data stored in the second memory block, in response to the bypass signal.

Each of the first memory block and the second memory block may include a plurality of phase-change memories. The data write block may further includes a write buffer for writing the write data to the first memory block by a First-in-First-Out FIFO method.

The control signal may be a write suspend command for suspending a write operation, and the control signal generation circuit may generate the control signal automatically. The semiconductor device may be configured to perform the write operation in units of words.

The control signal generator may include an address comparator configured to store the read and write addresses, and to generate the comparison signal based on the stored read and write addresses. The control signal generator may include a random access control block configured to generate the control and bypass signals based on the comparison signal.

Example embodiments provide a semiconductor system which may include a main control unit outputting a write command comprising write addresses and a read command comprising read addresses, and a semiconductor device capable of performing a write operation according to the write command and a read operation according to the read command.

The semiconductor device may include a memory cell array comprising a first memory block and a second memory block, a control signal generation circuit comparing the write addresses for selecting the first memory block with the read addresses for selecting the second memory block and generating a control signal according to the comparison result when the read command is input while the write operation is performed, and a data write block performing the write operation for writing write data input from the main control unit to the first memory block. An operation of the data write block may be controlled based on the control signal. The semiconductor system may be a PC, a smart card, or a mobile communication terminal.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF THE EMBODIMENTS

Figure 1:
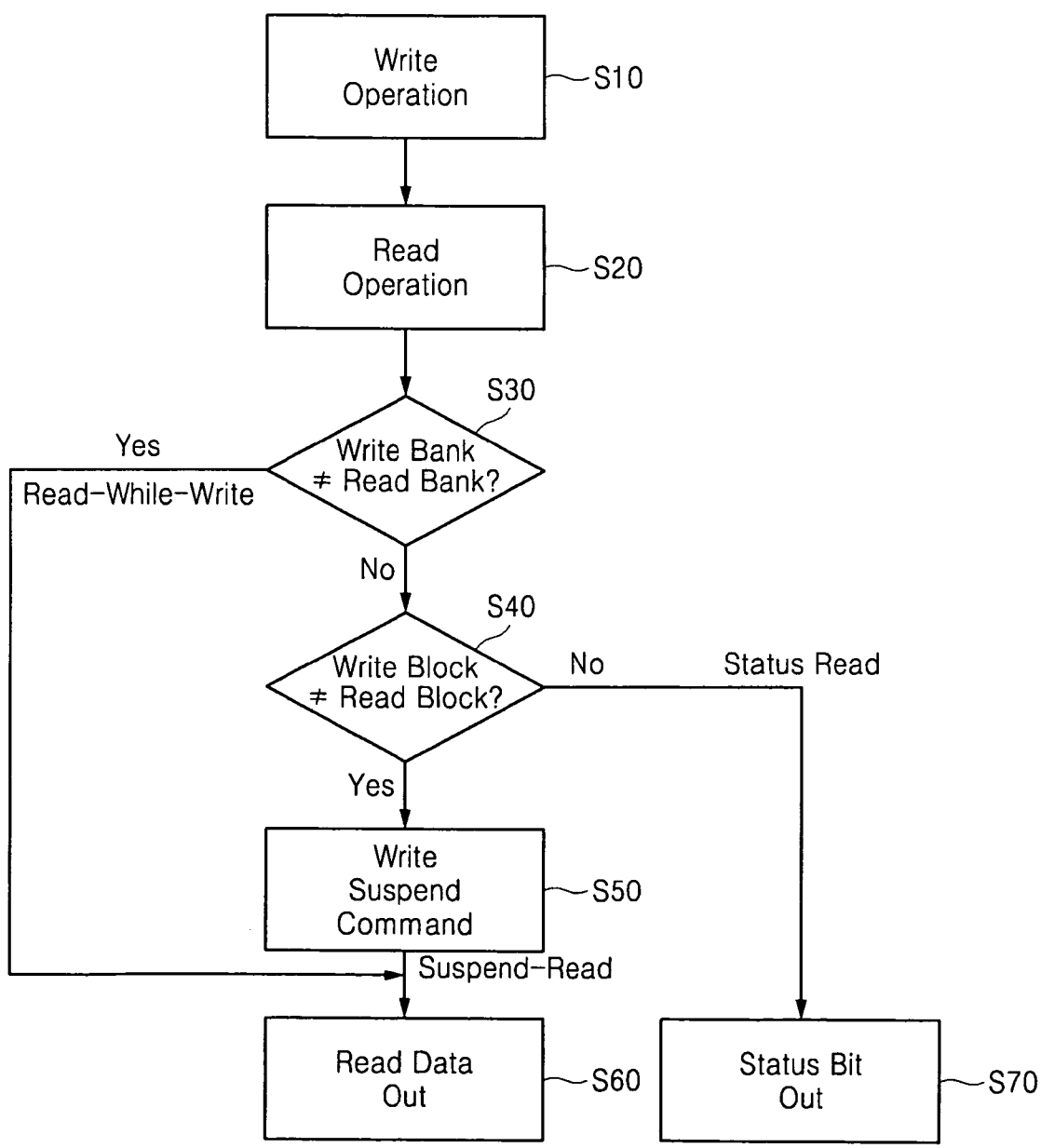
FIG. 1 is a flowchart for explaining a read operation of a conventional NOR flash memory device.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a flowchart for explaining a read operation of a conventional NOR flash memory device. Referring to FIG. 1, in operation S10, a conventional NOR flash memory device (not shown) including a memory cell array in which a plurality of memory cells, e.g., NOR flash memory cells, are embodied may perform a write operation, e.g., a program operation or an erase operation, in response to a write command, e.g., a program command or an erase command.

In operation S20, a read command for performing a read operation is input while the write operation is performed. In operation S30, the NOR flash memory device, may compare a write address included in the write command with a read address included in the read command.

The write address may be an address for selecting a first memory bank and the read address may be an address for selecting a second memory bank. In operation S30, when the first memory bank which is accessed for performing a write operation and the second memory bank which is accessed for performing a read operation are different from each other, the method may proceed to operation S60. In operation S60, the NOR flash memory device may output data stored in a second memory bank selected by the read address, while performing a write operation.

However, when, in operation S30, the write address is an address for selecting a first memory block, the read address is an address for selecting a second memory block, and the first and second memory blocks are included in the same memory bank, the method may proceed to operation S40. In operation S40, if the first and second block are different blocks, the method may proceed to operation S50 and the NOR flash memory device may suspend a write operation in response to a write suspend command input by a user. Next, in operation S60, the NOR flash memory device may output data stored in a second memory block of a first memory bank selected by the read address. Since the NOR flash memory device may suspend a write operation so as to perform a read operation, a random access read characteristic of the NOR flash memory device may be low.

Additionally, in operation S40, when the write address is an address for selecting a first memory block embodied in a first memory bank and the read address is an address for selecting the first memory block, meaning the first memory block accessed for performing a write operation is the same as the second memory block accessed for performing a read operation, the method may proceed to operation S70, and the NOR flash memory device may output a status bit which shows a current operation status of the NOR flash memory device, instead of outputting data stored in the first memory block of the first memory bank selected by the read address as in operation S60.

In the case of an erase operation, the erase operation may be performed by a memory block unit or a block unit, so that it may be impossible to read data stored in a memory block where a write operation is being performed.

Figure 2:
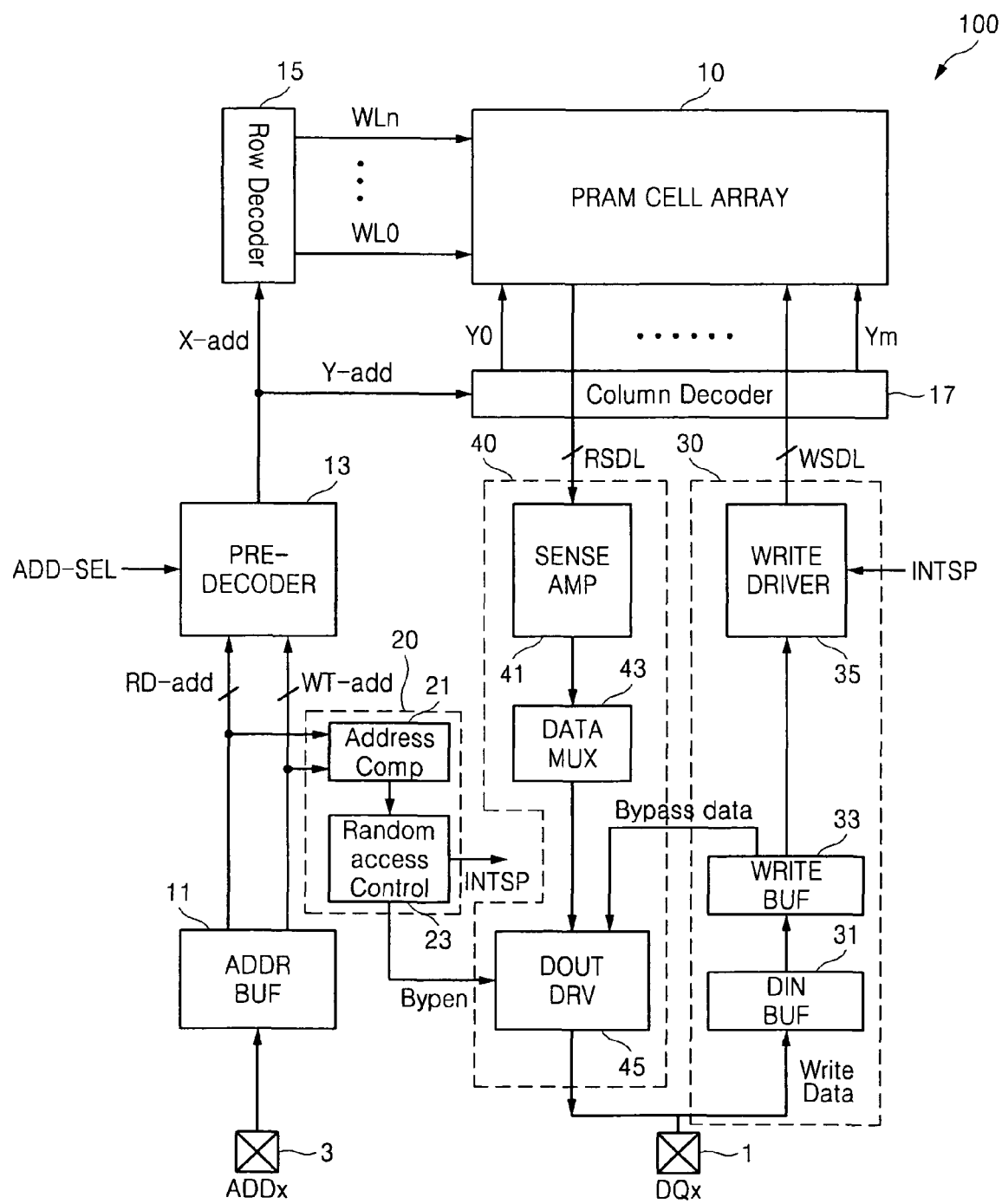
FIG. 2 is a block diagram of a semiconductor device according to example embodiments.

FIG. 2 is a block diagram of a semiconductor device according to example embodiments. Referring to FIG. 2, a semiconductor device 100 according to example embodiments may include a memory cell array 10, which may include a plurality of phase-change memories PCM, a control signal generation circuit 20, a data write block 30, and a data output block 40. The semiconductor device 100 may further include a plurality of peripheral circuits 11, 13, 15, and 17.

The memory cell array 10 may include a plurality of word lines WL0 to WLn (where n is a natural number), a plurality of bit lines Y0 to Ym (where m is a natural number), and a plurality of phase-change memories connected between the plurality of word lines WL0 to WLn and the plurality of bit lines Y0 to Ym. A phase-change memory PCM, which may be a kind of non-volatile memory, may also be referred to as PRAM, PCRAM, Ovonic Unified Memory OUM, or Chalcogenide RAM C-RAM.

An address buffer 11 may output addresses ADDx input through address pins 3, e.g., addresses WT-add or RD-add buffered by buffering write addresses or read addresses, respectively. A pre-decoder 13 may output row addresses X-add and column addresses Y-add by pre-decoding addresses WT-add or RD-add buffered by an address buffer 11 in response to an address selection signal ADD-SEL.

A row decoder 15 may select one of a plurality of word lines WL0 to WLn in response to row addresses X-add output from the pre-decoder 13. A column decoder 17 may select one of a plurality of bit lines Y0 to Ym in response to column addresses Y-add output from the pre-decoder 13. A control signal generation circuit 20 may receive and compare write addresses WT-add and read addresses RD-add output from an address buffer 11, and generate a control signal INTSP and a bypass signal Bypen according to a comparison result. The control circuit may compare write addresses WT-add and read addresses RD-add, for example, by a bit unit or bit-wise.

A semiconductor device 100 according to example embodiments, may include a control signal generation circuit 20, and may generate a control signal INTSP, i.e., a write suspend signal, automatically, or in response to an internal signal, according to a result of comparing write addresses WT-add with read addresses RD-add. However, a conventional NOR flash memory device explained referring to FIG. 1 may not suspend a write operation automatically when a read command for performing a read operation is input while a write operation is performed. With the semiconductor device 100 according to example embodiments, a control signal INTSP may be used as a control signal enabling or disabling an operation of a write driver 35 embodied in a data write block 30.

For example, a write driver 35 may perform a driving operation driving write data to a memory cell array 10 in response to a control signal INTSP having a first level, e.g., a high level, and suspend the driving operation in response to a control signal INTSP having a second level, e.g., low level, until a read operation is completed. Moreover, a bypass signal Bypen may control an operation of an output driver 45 so as to output write data which is being buffered by a write buffer 33 which may be included in a data write block 30.

A control signal generation circuit 20 may output a control signal INTSP having a first level and a bypass signal having a first level in response to a release signal output from a controller (not shown), which is capable of controlling a write operation and a read operation, when a read operation is finished. Therefore, a data write block 30 of a semiconductor device 100 may perform a write operation after a read operation is finished. A control signal generation circuit 20 may include an address comparator 21 and a random access control block 23. An address comparator 21 may include memories, e.g., registers, capable of storing write addresses WT-add and read addresses RD-add. According to example embodiments, the memories may be included in an address buffer 11 instead of a control signal generation circuit 20.

An address comparator 21 may compare write addresses WT-add with read addresses RD-add and output a comparison signal according to a comparison result. The comparison signal may include a plurality of bits. A random access control block 23 may generate a control signal INTSP and a bypass signal Bypen according to a comparison signal output from an address comparator 21.

An input buffer 31 of a data write block 30 may buffer write data input through data pins 1. A write buffer 33 may buffer write data output from an input buffer 31 and output buffered data to a write driver 35 or an output driver 45. For example, a write buffer 33 may be embodied as a First-In-First-Out (FIFO)-type buffer.

A conventional NOR flash memory device may perform a write operation in response to a command input from outside the NOR flash memory device after a write buffer is fully filled. Therefore, a random access write characteristic may be lower. However, a write buffer 33 of a data write block 30 included in the semiconductor device 100 according to example embodiments may instantly, or in a short period of time, write write data input to a memory block or memory cell of a memory cell array selected by write addresses when a write buffer 33 is full. Therefore, with the semiconductor device 100 according to example embodiments a random access write operation may be performed.

According to example embodiments, a write buffer 33 may output write data output from an input buffer 31 or write data which is being buffered to an output driver 45 in response to a control signal INTSP. Additionally, according to example embodiments, an input buffer 31 may output write data output from an input buffer 31 or write data being buffered to an output driver 45 in response to a control signal INTSP.

A write driver 35 may perform a driving operation driving write data output from a write buffer 33 to a memory cell array 10 or may suspend the driving operation until a read operation is finished in response to a control signal INTSP. When a driving operation is performed during a write operation, a write driver 35 may write, e.g., program, write data to a memory block of a memory cell array 10 selected by write addresses WT-add through write data lines WSDL.

When a read operation is performed, a sense amplifier 41 of a data output block 40 may receive data, which is stored in a memory block of a memory cell array 10 selected by read addresses RD-add, through read serve data lines RSDL. The sense amplifier 41 may amplify the received data by sensing the received data. A data selector 43 may output data output from the sense amplifier 41 selectively in response to at least one selection signal (not shown). An output driver 45 may drive data output from the data selector 43 to data input/output pins 1.

For example, an output driver 45 may drive data, which is output from a memory cell array 10 selected by read addresses RD-add, to data input/output pins 1 in response to a bypass signal Bypen having a first level, e.g., a high level. Alternatively, an output driver 45 may drive write data output from an output buffer 33, instead of data output from a memory cell array 10, to data input/output pins 1 in response to a bypass signal Bypen having a second level, e.g., a low level.

Figure 3:
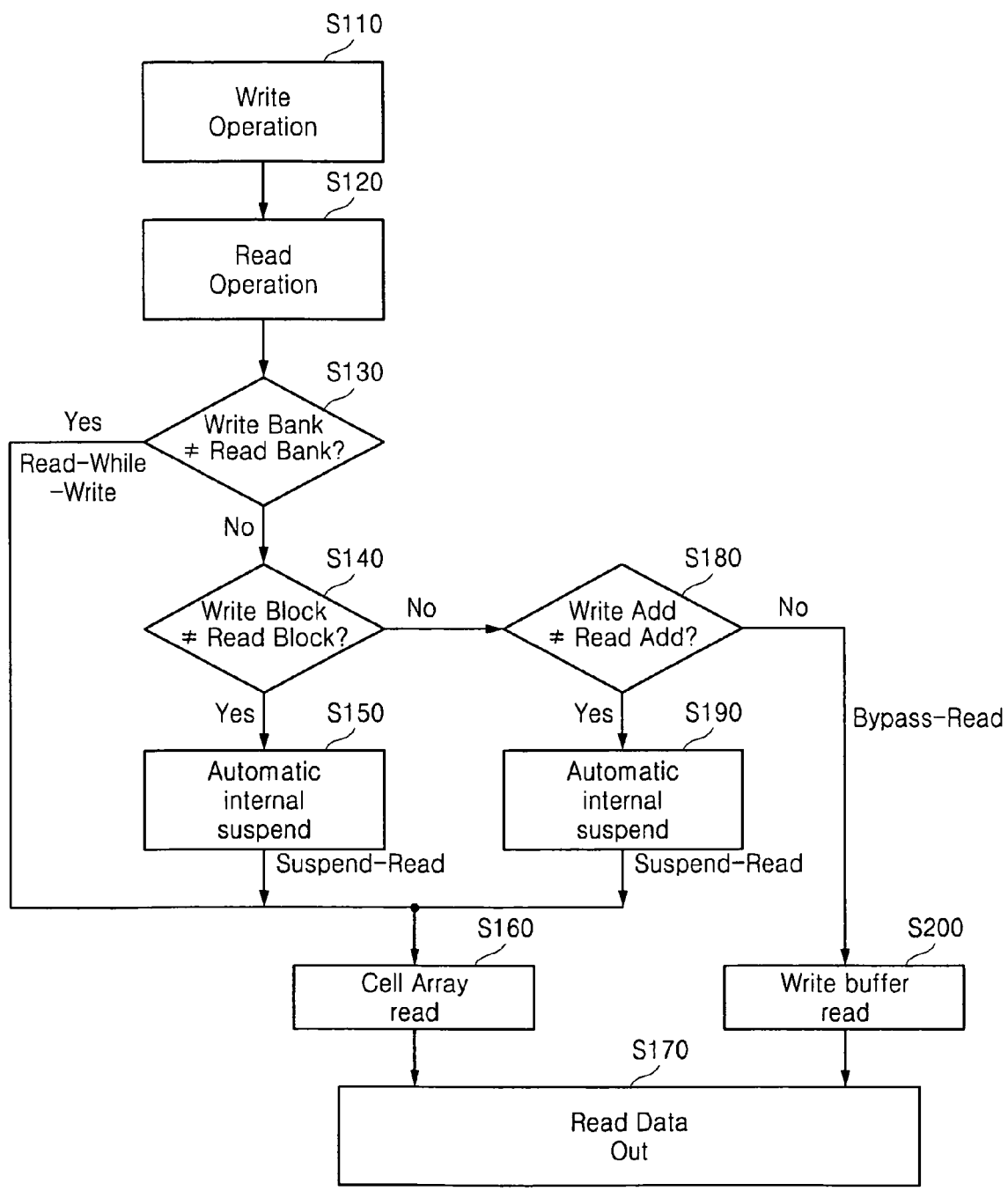
FIG. 3 is a flowchart for explaining an operation of a semiconductor device illustrated in FIG. 2.

FIG. 3 is a flowchart for explaining an operation of a semiconductor device illustrated in FIG. 2. Referring to FIGS. 2 and 3, when a read command is input while a write operation is performed, an operation of a semiconductor device according to example embodiments may be explained as follows.

In operation S110, the semiconductor device 100 may perform a write operation, e.g., a program operation or an erase operation, in response to a write command, e.g., a program command or an erase command. In operation S110, the semiconductor device 100 may perform a write operation writing write data to a memory region, e.g., a memory bank or a memory block, of a memory cell array 10 selected by write addresses WT-add included in a write command. A memory cell array 10 may includes a plurality of memory banks and the plurality of memory banks may each include a plurality of memory blocks, respectively.

In operation S120, a read operation for performing a read operation may be input while a semiconductor device 100 performs the write operation of operation S110. Next, in operation S130 the control signal generation circuit 20 of the semiconductor device 100 may compare write addresses WT-add included in the write command with read addresses RD-add included in the read command to each other.

The write addresses WT-add may be addresses for selecting a first memory block of a first memory bank (not shown) included in a memory cell array 10 and the read addresses RD-add may be addresses for selecting a first memory block of a second memory bank (not shown) included in a memory cell array 10. In operation S130, when a memory bank accessed when a write operation is performed and a memory bank accessed when a read operation is performed are different from each other, a control signal generation circuit 20 may generate a control signal INSP having a first level and a bypass signal Bypen having a first level, and the method may proceed to operation S160.

Accordingly, in operation S160, a write driver 35 of a data write block 30 of a semiconductor device 10 may perform a write operation writing write data buffered by a write buffer 33 to a first memory block of the first memory bank selected by write addresses WT-add in response to a control signal INTSP having a first level. Here, a data output block 40 of a semiconductor device 100 operating in response to a bypass signal Bypen having a first level may perform a read operation outputting data stored in a first memory block of a second memory bank (not shown) selected by read addresses Rd-add.

In operation S170, a semiconductor device 100 may perform a read operation outputting data stored in a first memory block of a second memory bank selected by read addresses RD-add, while performing a write operation. However, when write addresses WT-add are addresses for selecting a first memory block (not shown), read addresses RD-add are addresses for selecting a second memory block, and the first and second memory blocks are included in the same memory bank, the method may proceed to operation S140. In operation S140, the first and second memory blocks may be compared. In operation S140, when and the first and second memory blocks accessed respectively are different, a control signal generation circuit 20 may compare write addresses WT-add with read addresses RD-add to each other and generate a control signal INTSP having a second level and a bypass signal Bypen having a first level as a result of comparison, and the method may proceed to operation S150.

In operation S150, a write driver 35 of a data write block 30 included in a semiconductor device 100 may suspend a write operation automatically, or in response to an internal signal, until a read operation is finished in response to a control signal INTSP having a second level. While the write operation is suspended, the method may proceed to operation S160 and a data output block 40 of the semiconductor device 100, which may receive a bypass signal Bypen having a first level, may perform a read operation outputting data stored in a second memory block of a first memory bank (not shown) selected by read addresses RD-add.

Accordingly, when a memory bank accessed during a write operation is the same as a memory bank accessed during a read operation, and a first and second memory block are different, in operation S150, a data write block 30 of a semiconductor device 100 may suspend a write operation automatically in response to a control signal INTSP having a second level so as to perform a read operation first. The data write block 30 of the semiconductor device 100 may perform a write operation after a read operation is completed.

In addition, when write addresses WT-add and the read addresses RD-add are both addresses for selecting the same memory block (not shown), the method may proceed to operation S180 and a control signal generation circuit 20 may compare write addresses WT-add with read addresses RD-add each other and generates a control signal INTSP having a second level and a bypass signal Bypen having a first level as a result of the comparison.

In operation S180, if write addresses WT-add and read addresses RD-add are not the same address, the method may proceed to operation S190 and a write driver 35 of a data write block 30 of a semiconductor device 100 may suspend a write operation automatically, or in response to an internal signal, until a read operation is finished. Next the method may proceed to operation S160. In operation S160, while the write operation is suspended, a data output block 40 of a semiconductor device 100, which is operating in response to a bypass signal Bypen having a first level, may perform a read operation outputting data stored in a first memory block of a first memory bank (not shown) selected by read addresses RD-add. Therefore, a semiconductor device 100 may output data stored in a first memory block of a first memory bank to outside through data pins 1.

Accordingly, when a memory block of a memory bank accessed during a write operation is the same as a memory block of a memory bank accessed during a read operation, and the write addresses WT-add and read addresses RD-add are different, in operation S190, a semiconductor device 100 may suspend a write operation automatically, or in response to an internal signal, to perform a read operation. However, when, in operation S180, read addresses RD-add and write addresses WT-add are the same, for example, when reading data associated with a memory address where a write operation is being performed, a control signal generation circuit 20 may compare write addresses WT-add with read addresses RD-add and generates a control signal INTSP having a first level and a bypass signal Bypen having a second level as a result of the comparison, and the method may proceed to operation S200.

Accordingly, in operation S200, a write driver 35 of a data write block 30 of a semiconductor device 100 may perform a write operation writing write data to a memory block or a memory cell selected by write addresses WT-add in response to a control signal INTSP having a first level. At the same time, in operation S200, an output driver 45 of a data output block 40 may drive data which is being buffered or programmed by an input buffer 31 or a write buffer 33 to data input/output pins 1, instead of reading data stored in the memory block or the memory cell selected by read addresses RD-add in response to a bypass signal Bypen having a second level.

Next, in operation S170, a semiconductor device 100 may perform a bypass operation outputting data which is stored in an input buffer 31 or a write buffer 33 and are being programmed to an output driver 45. Accordingly, a semiconductor device 100 according to example embodiments may perform a write operation by word unit so that suspend recovery time of the semiconductor device 100, where suspend recovery time is time taken until a write operation is performed again after a write operation is suspended to perform a read operation, may become considerably shorter than suspend recovery time of a NOR flash memory.

When a conventional NOR flash memory performs an erase operation, a suspend recovery time of the NOR flash memory device may be fairly long. Accordingly, a random access characteristic of a conventional NOR flash memory device may be considerably low. In addition, when a read command for performing a read operation is input while a write operation is performed, it may be preferred for the NOR flash memory device to respond to an external command for suspending the write operation. However, with a semiconductor device 100 according to example embodiments, when a read command for performing a read operation is input while a write operation is performed, the semiconductor device 100 may suspend the write operation automatically, without requiring a suspend command input from outside, so that a random access characteristic of the semiconductor device 100 may be superior to one of a conventional NOR semiconductor device.

Additionally, since a semiconductor device 100 according to example embodiments may use phase-change memories, the semiconductor device 100 may not have a history effect. According to example embodiments, since a semiconductor device 100 does not require recovery time, it may perform a read operation instantly, or in a short period of time. However, a conventional NOR flash memory device may have a substantial history effect. The conventional NOR flash memory device may require a certain recovery time which may result in a limit in improving a random access characteristic.

Figure 4:
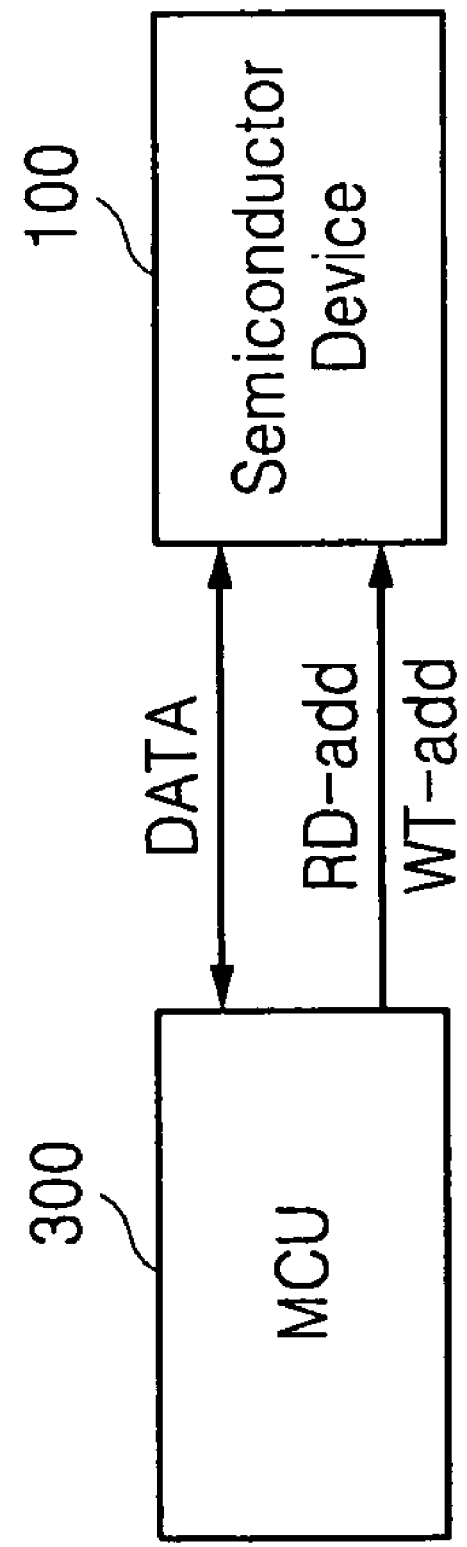
FIG. 4 is a block diagram of a semiconductor system including a semiconductor device according to example embodiments.

FIG. 4 is a block diagram of a semiconductor system including a semiconductor device according to example embodiments. Referring to FIGS. 3 and 4, a semiconductor system, for example, a data processing device, may include a semiconductor device 100 and a main control unit 300. A main control unit 300 may output a write command including write addresses WT-add to perform a write operation and a read command including read addresses to perform a read operation to a semiconductor device 100, respectively.

A main control unit 300 may output a write data DATA to a semiconductor device 100 during a write operation and receives read data DATA output from a semiconductor device 100 during a read operation. The semiconductor system may further include a CPU or a host capable of exchanging data with a main control unit 300 through an interface (not shown) or a bus (not shown).

A semiconductor device 100 may include a memory cell array 10, a control signal generation circuit 20, a data write block 30, and a data output block 40. A control signal generation circuit 20 may compare write addresses WT-add for selecting a first memory block of a memory cell array 10 with read addresses RD-add for selecting a second memory block of a memory cell array 10 with each other, and generate a control signal INTSP according to the comparison result.

A data write block 30 may perform the write operation for writing write data output from a main control unit 300 to the first memory block. An operation of the data write block 30 may be controlled in response to a control signal INTSP. A data output block 40 may perform the read operation for outputting data stored in the second memory block to a main control unit 300.

The semiconductor device 100 illustrated in FIG. 4 may operate in the same manner discussed above with reference to FIGS. 2 and 3. A semiconductor system according to example embodiments may be applied to any semiconductor systems which are capable of writing and reading data by using phase-change memories including, for example, a PC, a mobile terminal, a smart card, or a data storing device.

A semiconductor device according to example embodiments may perform a random access read operation regardless of performance of a write operation. A semiconductor device according to example embodiments may perform a write operation by units of words, so that it has a superior suspend recovery time.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A semiconductor device comprising:
   a memory cell array including a first memory block and a second memory block;
   a control signal generation circuit configured to compare write addresses included in a write command for selecting the first memory block with read addresses included in a read command for selecting the second memory block and generate a control signal based on the comparison, if the read command for performing a read operation is input while a write operation is performed; and
   a data write block configured to perform the write operation for writing write data to the first memory block,
   wherein the data write block is configured so that an operation of the data write block is controlled based on the control signal.

2. The semiconductor device of claim 1, further comprising:
   a data output block configured to perform the read operation by outputting data stored in the second memory block,
   wherein the data write block is configured so that, if the first memory block and the second memory block are included in a same memory bank, operation of the data write block is suspended until the read operation is finished in response to the control signal.

3. The semiconductor device of claim 1, further comprising:
   a data output block configured to perform the read operation by outputting data stored in the second memory block,
   wherein the data write block is configured so that, when the first memory block and the second memory block are the same memory block, operation of the data write block is suspended until the read operation is finished in response to the control signal.

4. The semiconductor device of claim 3, wherein the control signal generation circuit is configured to further output a bypass signal when the write addresses and the read addresses are the same addresses,
   wherein the data output block is configured to output the write data of the data write block instead of outputting the data stored in the second memory block in response to the bypass signal.

5. The semiconductor device of claim 1, wherein the first memory block and the second memory block each include a plurality of phase-change memories.

6. The semiconductor device of claim 1, wherein the data write block further includes a write buffer for writing the write data to the first memory block according to a First-in First-out (FIFO) method.

7. The semiconductor device of claim 1, wherein the control signal is a write suspend command for suspending the write operation, and the control signal generation circuit is configured to generate the control signal automatically.

8. The semiconductor device of claim 1, wherein the semiconductor device is configured to perform the write operation in units of words.

9. The semiconductor device of claim 1, wherein the control signal generation circuit includes an address comparator configured to store the read and write addresses, and to generate a comparison signal based on the stored read and write addresses.

10. The semiconductor device of claim 1, wherein the control signal generation circuit includes a random access control block configured to generate the control signal and a bypass signal based on a comparison signal.

11. A semiconductor system comprising:
    a main control unit outputting a write command including write addresses and a read command including read addresses; and the semiconductor device of claim 1, the semiconductor device being configured to perform the write operation according to the write command and the read operation according to the read command.

12. The system of claim 11, further comprising:

a data output block configured to perform the read operation by outputting data stored in the second memory block to the main control unit, wherein the data write block is configured so that, if the first memory block and the second memory block are included in a same memory bank, operation of the data write block is suspended until the read operation is finished in response to the control signal.

13. The system of claim 11, wherein the semiconductor device further comprises a data output block configured to perform the read operation by outputting data stored in the second memory block to the main control unit, wherein the data write block is configured so that if the first memory block and the second memory block are the same memory block, operation of the data write block is suspended until the read operation is finished in response to the control signal.

14. The system of claim 13, wherein the control signal generation circuit is configured to further output a bypass signal when the write addresses and the read addresses are the same addresses, wherein the data output block is configured to output the write data of the data write block where the write operation is being performed to the main control unit, instead of outputting the data stored in the second memory block, in response to the bypass signal.

15. The system of claim 11, wherein the semiconductor system is a PC, a smart card, or a mobile communication terminal.

16. The system of claim 11, wherein the data write block further includes a write buffer for writing the write data to the first memory block according to a First-in First-out (FIFO) method.

17. The system of claim 11, wherein the control signal is a write suspend command for suspending the write operation, and the control signal generation circuit is configured to generate the control signal automatically.

18. The system of claim 11, wherein the semiconductor device is configured to perform the write operation in units of words.

19. The system of claim 11, wherein the control signal generation circuit includes an address comparator configured to store the read and write addresses, and to generate a comparison signal based on the stored read and write addresses.

20. The system of claim 11, wherein the control signal generation circuit includes a random access control block configured to generate the control signal and a bypass signal based on a comparison signal.

* * * * *